United States Patent
Pidutti

Patent Number: 6,124,751
Date of Patent: Sep. 26, 2000

[54] BOOST CAPACITOR FOR AN H-BRIDGE INTEGRATED CIRCUIT MOTOR CONTROLLER HAVING MATCHING CHARACTERISTICS WITH THAT OF THE LOW-SIDE SWITCHING DEVICES OF THE BRIDGE

[75] Inventor: Albino Pidutti, Udine, Italy

[73] Assignee: STMicroelectronics, Inc., Carrollton, Tex.

[21] Appl. No.: 08/884,993

[22] Filed: Jun. 30, 1997

[51] Int. Cl.[7] .................................... H03K 17/56
[52] U.S. Cl. ..................... 327/424; 327/110; 327/390; 363/63
[58] Field of Search ...................... 327/108, 109, 327/110, 423, 424, 390, 436, 437, 589, 374–377; 363/63, 88; 330/146; 360/46, 67, 68

[56] References Cited

U.S. PATENT DOCUMENTS

| | | | |
|---|---|---|---|
| 4,454,454 | 6/1984 | Valentine | 318/293 |
| 4,535,203 | 8/1985 | Jenkins et al. | 379/333 |
| 5,221,881 | 6/1993 | Cameron | 318/254 |
| 5,285,135 | 2/1994 | Carobolante et al. | 318/254 |
| 5,297,024 | 3/1994 | Carobolante | 360/67 |
| 5,332,954 | 7/1994 | Lankin | 318/139 |
| 5,566,369 | 10/1996 | Carobolante | 360/75 |
| 5,642,065 | 6/1997 | Choi et al. | 327/110 |
| 5,712,536 | 1/1998 | Haas et al. | 315/247 |
| 5,757,215 | 5/1998 | Schuelke et al. | 327/110 |
| 5,841,603 | 11/1998 | Ramalho et al. | 360/68 |
| 5,867,334 | 2/1999 | Soichi et al. | 360/68 |
| 5,869,988 | 2/1999 | Jusuf et al. | 327/110 |

OTHER PUBLICATIONS

Pedrazzini, "IBM's Hard Disk Drive Load/Unload Technology," *Computer Data Storage Newsletter*, Jul. 1997, vol. 10(7), Issue No. 114, p. 12.

Irwin, Chap. 11, Maximum Average Power Transfer, Basic Engineering Circuit Analysis, 3rd edition, p. 453,454, 1990.

*Primary Examiner*—Timothy P. Callahan
*Assistant Examiner*—Minh Nguyen
*Attorney, Agent, or Firm*—David V. Carlson; Theordore E. Galanthay; Lisa K. Jorgenson

[57] ABSTRACT

An H-bridge circuit having a boost capacitor coupled to the gate of the low-side driver. A driver, in the form of a switching transistor is connected between the load and ground, thus providing a low-side driver. A capacitor is coupled to the gate of the low-side driver to provide a boosted voltage for rapid turn on of the gate. The size of the capacitor selected to be similar to the size of the capacitance associated with the low-side driver transistor.

21 Claims, 2 Drawing Sheets

BOOST CAPACITOR FOR AN H-BRIDGE INTEGRATED CIRCUIT MOTOR CONTROLLER HAVING MATCHING CHARACTERISTICS WITH THAT OF THE LOW-SIDE SWITCHING DEVICES OF THE BRIDGE

BACKGROUND OF THE INVENTION

The present invention relates, in general, to the field of direct current ("DC") motor control circuits. More particularly, the present invention relates to an integrated circuit ("IC") "H" switch, or H-bridge, motor control circuit incorporating a boost capacitor for the low-side metal oxide semiconductor ("MOS") transistor switching devices in the H-bridge in which the characteristics of the respective capacitors are closely matched to that of the associated switching device.

The DC low voltage fractional horsepower motor is a standard for applications that require bidirectional shaft control such as cassette tape drives, automobile power windows, seats, door locks or windshield wipers, robotic mechanical controls, small industrial machines etc. As such, H-bridge circuits have been developed in lieu of mechanical reversing gears and linkages for reversing the motor supply voltage. In an H-bridge, opposing top and bottom switching devices (bipolar, Darlington or MOS transistors for example) couple the DC motor input leads to a voltage source and circuit ground to control the motor direction by switching the voltage polarity, which, in turn, switches the motor's shaft rotation either clockwise or counter-clockwise.

Bipolar transistors are generally not satisfactory in these applications due to their relatively large base drive requirement and Darlington transistors exhibit a large forward voltage drop across the devices which reduce voltage to the motor. For these reasons, MOS transistors are often utilized in H-bridge applications as disclosed in U.S. Pat. No. 4,454,454 issued Jun. 12, 1984 for "MOSFET "H" Switch for a DC Motor".

Still other H-bridge circuits have utilized MOS transistors in order to control the current through the load in addition to switching voltage polarity. In this regard, the low-side switching devices function as current generators to force a defined current through the load. However, after each transition, the current generators take a finite time to reach a steady-state condition. In order to reduce this time and speed the overall system operation, an additional charge, through the use of an inverter and associated boost capacitor, may be added to the gate of the low-side switching devices. However, for optimal performance, there must be a good match between the boost capacitors and the input capacitance of the switching transistors. This is especially difficult to achieve in integrated circuit H-bridges due to the inherent variations in processing technology.

SUMMARY OF THE INVENTION

As mentioned previously, in order to provide effective boost, the boost capacitors must be closely matched with the respective input capacitance of the associated switching transistors. In order to effectuate this effective matching despite manufacturing process variations, the present invention may utilize the source structure of the transistors for the formation of the respective boost capacitors. Since the capacitors are basically MOS devices themselves, the gate of the associated transistor forms one terminal of the capacitors while the P-well forms the other terminal. The gate of these capacitors may consist of more poly fingers extending from the respective transistors in order to reproduce the same border effect of these devices.

Particularly disclosed herein is an integrated H-bridge circuit including first and second pairs of high-side and low-side switching devices for selectively coupling an electrical load between first and second voltage supply lines. The circuit comprises a boost capacitor coupled to a switching terminal of each of the low-side switching devices, with the boost capacitor having a capacitance substantially equivalent to an input capacitance of an associated one of the low-side switching devices.

In a particular embodiment, disclosed herein is a boost capacitor for supplying a voltage potential to an associated MOS transistor. The boost capacitor comprises a capacitor body formed in a portion of a semiconductor substrate with the capacitor body being formed of a first impurity type. A plurality of regions are formed in the capacitor body, with the regions being formed of a second, opposite impurity type. An insulating layer overlies the capacitor body between the plurality of regions and a conductive layer overlies the insulating layer. The effective capacitance of the boost capacitor is substantially equal to the conductive layer-to-capacitor body and the conductive layer-to-plurality of regions capacitance and is substantially equal to an input capacitance of the associated MOS transistor.

Further disclosed herein is a method for forming an integrated H-bridge circuit including a boost capacitor and an associated MOS transistor. The method comprises the steps of: providing a semiconductor substrate and forming first and second wells in the substrate overlying first and second buried layers. A plurality of regions are diffused in the first and second wells of an impurity type opposite to that of the first and second wells and an insulating layer is formed overlying the first and second wells between the diffused regions. A conductive layer is also formed overlying the insulating layer. The various structures are formed concurrently of the same materials and are laid out such that the corresponding dimensions of each are substantially identical where possible.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
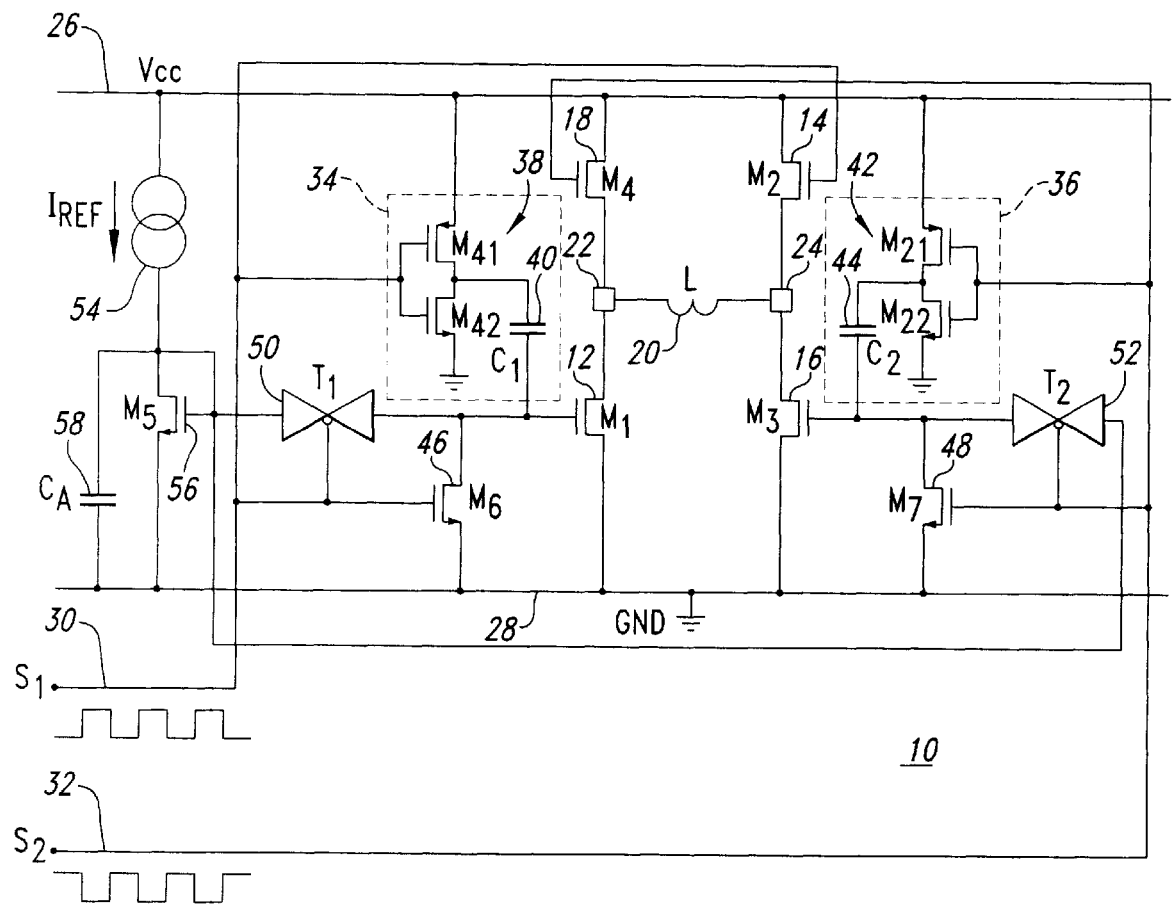
FIG. 1 is a schematic illustration of an H-bridge integrated circuit in accordance with the present invention illustrating the coupling of a DC load, for example a motor ("L") to the pair of high-side and low-side switching transistors in a full bridge configuration and illustrating the boost capacitors ("$C_1$") and ("$C_2$") associated respectively with the low-side switching transistors ("$M_1$") and ("$M_3$")

With reference now to FIG. 1, an H-bridge circuit 10 in accordance with the present invention is shown. The H-bridge circuit 10 comprises, in pertinent part, four MOS transistors, coupled in series connected pairs between a supply voltage rail and circuit ground. A load is coupled between the two series connected pairs resulting in an "H" configuration.

In this regard, the H-bridge circuit 10 comprises four MOS transistors 12 ($M_1$), 14 ($M_2$), 16 ($M_3$) and 18 ($M_4$) which are selectively activated to couple a DC load 20 (L), such as a DC motor for example, between a first supply voltage line 26 ("$V_{cc}$") and a second supply voltage line 28 ("Gnd"). For example, and ignoring any voltage drop across the source-to-drain of the transistors, when transistors 12 and 14 are activated, $V_{cc}$ appears on terminal 24 while terminal 22 is effectively at Gnd. Alternatively, when transistors 16 and 18 are activated, $V_{cc}$ is applied to terminal 22 while terminal 24 is essentially at Gnd. In the exemplary illustration shown, transistors 12 and 16 may be referred to as "low-side" transistors while transistors 14 and 18 may be referred to as "high-side" transistors. The transistors 12–18 function as switching devices and transistors 12 and 16 may be conveniently furnished as power N-channel MOS devices while the transistors 14 and 18 are preferably P-channel devices as N-channel devices would require a voltage source higher than $V_{cc}$ resulting in a more complex circuit design.

The H-bridge circuit 10 is activated by pulse width modulated ("PWM") signals appearing on signal lines 30 ("$S_1$") and 32 ("$S_2$"). As shown, the signals on lines 30 and 32 are 180 degrees out of phase with each other. Signal line 30 is coupled to the common connected gate terminals of two transistors ("$M_{41}$" and "$M_{42}$") coupled to form an inverter 38 and which, in combination with an associated boost capacitor 40, comprises a boosted inverter circuit 34. Signal line 30 is also coupled to the gate of high side transistor 14 ($M_2$). In like manner, signal line 32 is coupled to the common connected gate terminals of two transistors ("$M_{21}$" and "$M_{22}$") coupled to form an inverter 42 and which, in combination with an associated boost capacitor 44 comprise a boosted inverter circuit 36. Signal line 32 is also coupled to the gate of high-side transistor 18 ($M_4$).

As shown, signal line 30 is also coupled to the gate of an additional transistor 46 ("$M_6$") which couples the gate of low-side transistor 12 ($M_1$) to Gnd. In like manner, signal line 32 is coupled to the gate of transistor 48 ("$M_7$") which couples the gate of low-side transistor 16 ($M_3$) to Gnd. Signal lines 30 and 32 are further coupled to the control terminal of devices $T_1$ and $T_2$ respectively which serve to selectively couple the signal appearing on either the gate of low-side transistor 12 ($M_1$) or the gate of low-side transistor 16 ($M_3$) to the gate of transistor 56 ("$M_5$") which is coupled in series with a reference current source 54 ("$I_{REF}$") between the first supply voltage line 26 ($V_{cc}$) and the second supply voltage line 28. A capacitor 58 ("$C_A$") is coupled in parallel with the transistor 56 ($M_5$) as shown.

In order to provide effective boost, the boost capacitors 40 ($C_1$) and 44 ($C_2$) must be closely matched with the respective input capacitance of the associated transistors 12 ($M_1$) and 16 ($M_3$). In order to effectuate this effective matching despite manufacturing process variations, the present invention utilizes the source structure of transistors 12 ($M_1$) and 16 ($M_3$) for the formation of capacitors 40 and 44 respectively. Since the capacitors 40 and 44 are basically MOS devices themselves, the gate of transistors 12 and 14 form one terminal of the capacitors while the P-well forms the other terminal. The gate of these capacitors 40, 44 consists of more poly fingers extending from the respective transistors 12, 14 in order to reproduce the same border effect of these devices. This is shown more fully in the following figure as described hereinafter.

As further shown in FIG. 1, capacitor 58 ($C_A$) is placed in parallel with transistor 56 ($M_5$) to reduce the $\Delta V_{GS}$ of the device. As a consequence, the change in the gate-to-source voltage of transistor 56 may be given to a first approximation as:

$$\Delta V_{GS} = [V_{cc} * C_1 - V_{GS} M_5 (C_g M_1 + C_1)]/[C_g M_1 + C_1 + C_g M_5 + C_A]$$

Figure 2A:
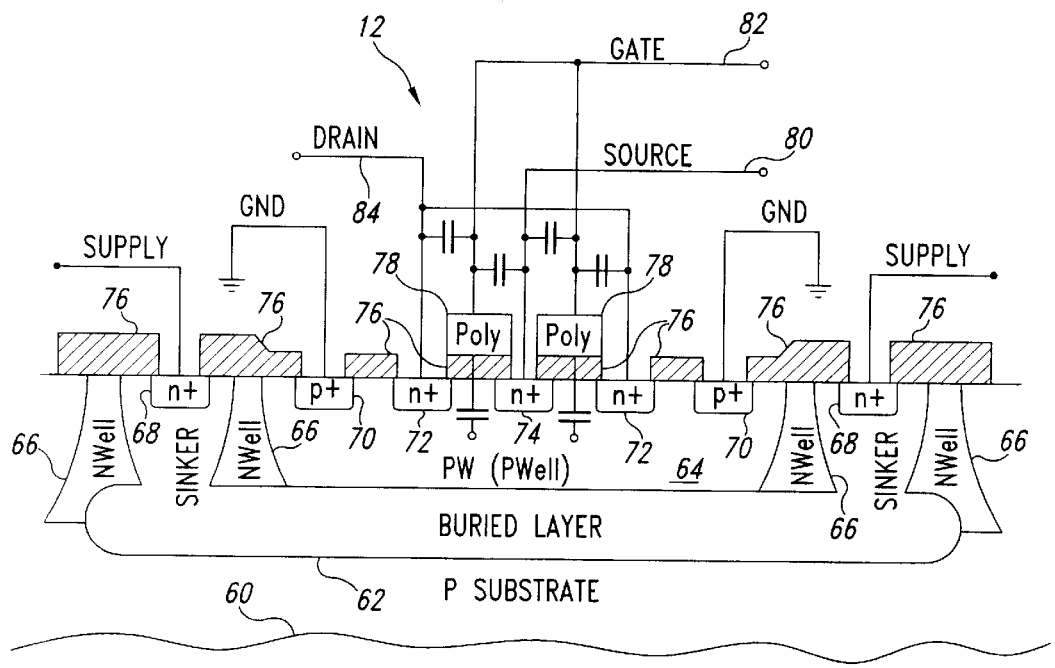
FIG. 2A is a partial cross-sectional drawing of one of the two low-side switching transistors (for example, $M_1$) illustrating the construction thereof.
Figure 2B:
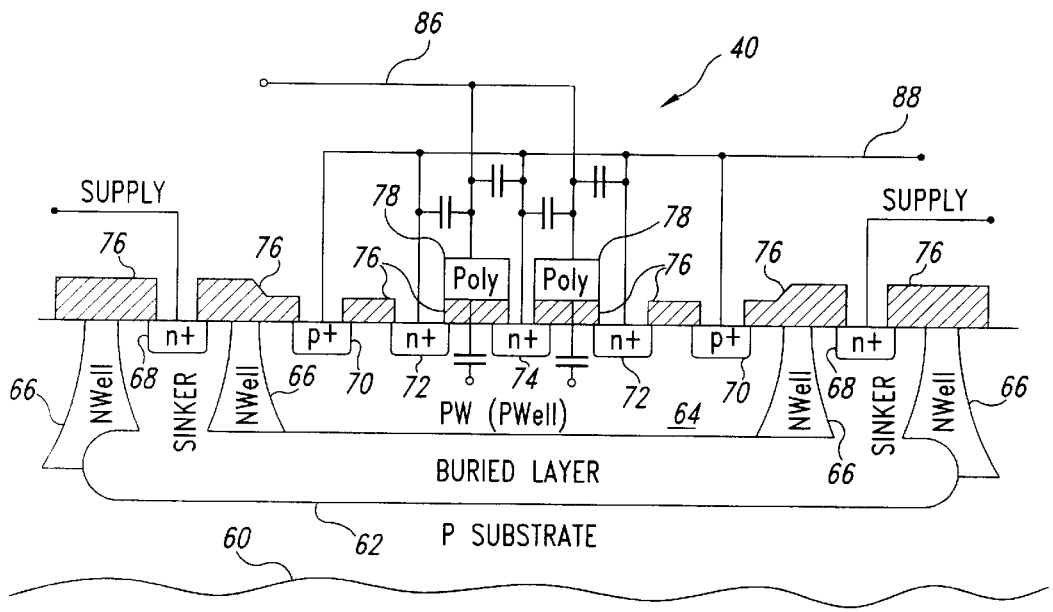
FIG. 2B is a corresponding, partial cross-sectional drawing of a corresponding one of the boost capacitors ($C_1$) illustrating the use of equivalent structure to that of the low-side switching transistor ($M_1$) to ensure matching characteristics.

With reference now to FIGS. 2A and 2B, partial cross-sectional views of transistor 12 ($M_1$) and boost capacitor 40 ($C_1$) are shown to illustrate corresponding structure and inherent capacitances of each circuit element. In the exemplary embodiment of the H-bridge 10 shown, both devices are formed on a P-type substrate 60 in which a buried layer 62 and associated sinkers are formed. A P-well 64 ("PW") is formed overlying the buried layer 62 and is isolated from the sinkers by N-wells 66, others of which serve to isolate the sinkers from the P-type substrate 60 as shown. A pair of N+ wells 68 are formed within the sinkers and a pair of P+ wells 70 are formed within the P-well 64. Drain regions for the transistor 12 are formed of N+ diffusions 72 in the P-well 64 along with an additional source region defined by an additional N+ diffusion 74. Oxide regions 76 (formed, for example, of silicon dioxide) are selectively patterned and etched overlying portions of the transistor 12 structure and also forming gate oxide underlying doped polysilicon gates 78.

As shown, the transistor is defined by electrical connections to the various N+ diffused regions 72, 74 with the drain 84 being coupled to N+ diffusions 72, the source 80 being coupled to N+ diffusion 74 and the gate 82 being coupled to the polysilicon gates 78. The polysilicon gates 78 exhibit an inherent capacitance to the P-well 64 through the underlying gate oxide 76 while there is also inherent capacitance between the gate 82 to source 80 and gate 82 to drain 84 portions of the transistor 12.

Correspondingly, and with particular reference to FIG. 2B, the boost capacitor 40 is laid out to have a structure and dimensions as similar to that of transistor 12 as is possible, with all of the inherent capacitance values therefore being as equivalent as that entails. Preferrably, the boost capacitor 40 and transistor 12 are formed concurrently during the manufacture of an integrated circuit version of the H-bridge 10. In this figure, the gate 86 (or one terminal) of the capacitor 40 is coupled to the two polysilicon gates 78 while the P-well 88 (or other terminal) of the capacitor 40 is coupled to the P+ diffusions 70 and N+ diffusions 72, 74 as shown.

Due to the fact that in the H-bridge 10 of FIG. 1 the sources the transistors 12, 14 ($M_1$ and $M_2$) are coupled to Gnd, the capacitance between the polysilicon gates 78 and the P-well 64 and the capacitance between the gates 78 and source 80 (coupled to N+ diffused region 74) are in parallel, they comprise the largest portion of the transistor 12, 14 input capacitance. It should be noted that the gate 78 to drain 84 (coupled to the N+ diffused regions 72) is not relatively large but it can be amplified due to the "early" effect. In any event, if the voltage drain does not change, there is effectively no "early" effect and it is possible to consider the gate-to-drain capacitance as in parallel with the gate-to-P-well and gate-to-source capacitances. The FIGS. 2A and 2B illustrate the comparable structures and inherent capacitances of the transistor 12 ($M_1$) and boost capacitor 40 ($C_1$) as an example and the same analysis would also pertain to transistor 16 ($M_3$) and associated boost capacitor 44 ($C_2$).

With particular reference to FIG. 2B, the boost capacitor 40 is shown wherein the total capacitance is the sum of the polysilicon gate 78 to P-well 64 capacitance and the gate 78 to N+ diffused regions 72 and 74 capacitance. Since the boost capacitor 40 has the same structure to that of the corresponding transistor 12, a good match is provided with its input capacitance. In practice, the best match is provided when the layout of the two devices is exactly the same. This implies that the same gate length, the same distance between the two gate fingers and other dimensions are the same. However, in certain design layouts, an exact match might be difficult due to die size concerns. For this reason, it is also contemplated by the present invention that the polysilicon fingers of the boost capacitor 40 may be made larger than the gate fingers of the transistor 12. Moreover, the distance between the respective fingers may be somewhat different and still provide an effective capacitance match.

The boost capacitor 40, 44 values are ultimately dependent upon the input capacitance of the associated transistor 12, 16, its gate-to-source voltage and on the supply voltage $V_{cc}$. While these factors define the value of the boost capacitor 40, it is usually different from the input capacitance of the associated transistor 12. On the other hand, the layout structure of the boost capacitors 40, 44 and the associated transistors 12, 16 is the same. This means that both structures are formed by more polysilicon fingers. While the dimensions of these polysilicon fingers are preferably the same, the number of the fingers may be different.

While there have been described above the principles of the present invention in conjunction with specific device structure and processing steps, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated H-bridge circuit including first and second pairs of high-side and low-side switching devices to selectively couple an electrical load between first and second voltage supply lines, said circuit comprising:
    a boost capacitor coupled to a switching terminal of each of said low-side switching devices, said boost capacitor having a capacitance substantially equivalent to an input capacitance of an associated one of said low-side switching devices;
    a boost capacitor enable circuit coupled to the boost capacitor to enable a boosted capacitor voltage to be provided on the switching terminal of a respective low-side switching device, wherein said boost capacitor enable circuit includes a boosted inverter circuit; and
    a pull-down circuit having a current carrying terminal connected to the switching terminal of each respective low-side switching device and having a control terminal connected as an input for grounding the switching terminal of the respective low-side switching device in response to an input signal.

2. The integrated H-bridge circuit of claim 1 wherein said high-side and low-side switching devices comprise MOS transistors.

3. The integrated H-bridge circuit of claim 2 wherein said low-side switching devices comprise N-channel MOS transistors.

4. The integrated H-bridge circuit of claim 2 wherein said boost capacitor comprises an MOS capacitor.

5. The integrated H-bridge circuit of claim 2 wherein said input capacitance of said low-side switching device is substantially equal to a sum of a gate-to-body and gate-to-source capacitance.

6. The integrated H-bridge circuit of claim 2 wherein said capacitance of said boost capacitor is substantially equal to a sum of a first terminal-to-body and a second terminal-to-diffusion region capacitance.

7. The integrated H-bridge circuit of claim 1 wherein said boost capacitor and said low-side switching device have a substantially similar physical layout.

8. The integrated H-bridge circuit of claim 7 wherein physical dimensions of said boost capacitor and said low-side switching device are substantially identical.

9. The integrated H-bridge circuit of claim 1, further comprising:
    an additional switching device having a control and first and second current carrying terminals thereof, said control terminal being coupled to said first current carrying terminal;
    a current source coupled in series with said first and second current carrying terminals of said additional switching device between said first and second voltage supply lines;
    an additional capacitor coupled across said first and second current carrying terminals of said additional switching device; and
    an electrical connection between the control terminal of the additional switching device and the switching terminal of the respective low-side switching device.

10. The integrated H-bridge circuit of claim 9 wherein said additional capacitor is effective to reduce a control terminal-to-second current carrying terminal capacitance of said additional switching device.

11. The integrated H-bridge circuit according to claim 1, further including:
    the input signal being coupled to an input of the boosted inverter circuit.

12. The integrated H-bridge circuit according to claim 1 further including:
    a current source having an output coupled to the switching terminal of the low-side switching device; and
    a transfer gate selectively coupling the output of the current source to the switching terminal under control of the input signal.

13. The circuit according to claim 12 wherein the boost capacitor enable circuit comprises the boosted inverter circuit having a CMOS inverter therein.

14. An integrated H-bridge circuit including first and second pairs of high-side and low-side switching devices to selectively couple an electrical load between first and second supply lines, said circuit comprising:
    a boost capacitor coupled to a switching terminal of each of said low-side switching devices, said boost capacitor having a capacitance substantially equivalent to an input capacitance of an associated one of said low-side switching devices;

a boost capacitor enable circuit coupled to the boost capacitor to enable a boosted capacitor voltage to be provided on the switching terminal of the respective low-side switching device;

an additional switching device having a control terminal and first and second current carrying terminals;

a current source coupled in series with said first and second current carrying terminals of the additional switching device;

an additional capacitor coupled across said first and second current carrying terminals of the additional switching device; and an electrical connection between the control terminal of the additional switching device and the switching terminal of at least one of the low-side switching devices.

15. The circuit according to claim 14 wherein said electrical connection includes a transfer gate to selectively connect the control terminal of the additional switching device to the switching terminal of the low-side switching device.

16. The circuit according to claim 15, further including an input control signal coupled to the transfer gate and to the boost capacitor enable circuit to enable the transfer gate at the same time that the boost capacitor enable circuit is enabled.

17. The circuit according to claim 14 wherein the boost capacitor enable circuit includes a boosted inverter circuit.

18. An integrated H-bridge circuit including first and second pairs of high-side and low-side switching devices to selectively couple an electrical load between first and second voltage supply lines, said circuit comprising:

a boost capacitor coupled to a switching terminal of each of said low-side switching devices, said boost capacitor having a capacitance substantially equivalent to an input capacitance of an associated one of said low-side switching devices;

a boost capacitor enable circuit coupled to the boost capacitor to enable a boosted capacitor voltage to be provided on the switching terminal of a respective low-side switching device, wherein said boost capacitor enable circuit includes a boosted inverter circuit;

an additional switching device having a control and first and second current carrying terminals thereof, said control terminal being coupled to said first current carrying terminal;

a current source coupled in series with said first and second current carrying terminals of said additional switching device between said first and second voltage supply lines;

an additional capacitor coupled across said first and second current carrying terminals of said additional switching device, wherein said additional capacitor is effective to reduce a control terminal-to-second current carrying terminal capacitance of said additional switching device; and an electrical connection between the control terminal of the additional switching device and the switching terminal of the respective low-side switching device.

19. An integrated H-bridge circuit including first and second pairs of high-side and low-side switching devices to selectively couple an electrical load between first and second voltage supply lines, said circuit comprising:

a boost capacitor coupled to a switching terminal of each of said low-side switching devices, said boost capacitor having a capacitance substantially equivalent to an input capacitance of an associated one of said low-side switching devices;

a boost capacitor enable circuit coupled to the boost capacitor to enable a boosted capacitor voltage to be provided on the switching terminal of a respective low-side switching device, wherein said boost capacitor enable circuit includes a boosted inverter circuit;

a current source having an output coupled to the switching terminal of a low-side switching device; and a transfer gate selectively coupling the output of the current source to the switching terminal under control of an input signal.

20. An integrated H-bridge circuit including first and second pairs of high-side and low-side switching devices to selectively couple an electrical load between first and second voltage supply lines, said integrated H-bridge circuit comprising:

a boost capacitor coupled to a switching terminal of each of said low-side switching devices, said boost capacitor having a capacitance substantially equivalent to an input capacitance of an associated one of said low-side switching devices;

a boost capacitor enable circuit coupled to the boost capacitor to enable a boosted capacitor voltage to be provided on the switching terminal of a respective low-side switching device, wherein said boost capacitor enable circuit includes a boosted inverter circuit;

an additional switching device coupled to one of the low-side switching devices and having a control and first and second current carrying terminals; and an additional capacitor coupled across said first and second current carrying terminals of said additional switching device.

21. An integrated H-bridge circuit including first and second pairs of high-side and low-side switching devices to selectively couple an electrical load between first and second voltage supply lines, said circuit comprising:

a boost capacitor coupled to a switching terminal of each of said low-side switching devices, said boost capacitor having a capacitance substantially equivalent to an input capacitance of an associated one of said low-side switching devices;

a boost capacitor enable circuit coupled to the boost capacitor to enable a boosted capacitor voltage to be provided on the switching terminal of a respective low-side switching device, wherein said boost capacitor enable circuit includes a boosted inverter circuit;

an additional switching device having a control and first and second current carrying terminals thereof, said control terminal being coupled to said first current carrying terminal;

a current source coupled in series with said first and second current carrying terminals of said additional switching device between said first and second voltage supply lines;

an additional capacitor coupled across said first and second current carrying terminals of said additional switching device; and an electrical connection between the control terminal of the additional switching device and the switching terminal of the respective low-side switching device.

* * * * *